United States Patent [19]

Anzai et al.

[11] Patent Number: 4,529,456
[45] Date of Patent: Jul. 16, 1985

[54] METHOD OF FORMING BIFETS BY FORMING ISOLATION REGIONS CONNECTED BY DIFFUSION IN SEMICONDUCTOR SUBSTRATE AND EPITAXIAL LAYER

[75] Inventors: Norio Anzai, Tokorozawa; Hideki Yasuoka, Takasaki, both of Japan

[73] Assignee: Hitachi, Ltd., Tokyo, Japan

[21] Appl. No.: 531,708

[22] Filed: Sep. 13, 1983

[30] Foreign Application Priority Data

Sep. 24, 1982 [JP] Japan ................................ 57-164840

[51] Int. Cl.$^3$ ..................... H01L 21/265; H01L 21/20
[52] U.S. Cl. .................................. 148/186; 29/576 B; 29/577 C; 148/1.5; 148/187; 357/34; 357/91
[58] Field of Search .................. 148/186, 1.5, 187; 29/577 C, 576 B, 571; 357/34, 91

[56] References Cited

U.S. PATENT DOCUMENTS

| | | | |
|---|---|---|---|
| 4,168,997 | 9/1979 | Compton | 148/175 |
| 4,295,898 | 10/1981 | Yoshida et al. | 148/1.5 |
| 4,346,512 | 8/1982 | Liang et al. | 29/571 |
| 4,362,574 | 12/1982 | Gevondyan | 148/1.5 |
| 4,403,395 | 9/1983 | Curran | 29/571 |
| 4,443,933 | 4/1984 | DeBrebisson | 29/578 |

FOREIGN PATENT DOCUMENTS 2043337A 10/1980 United Kingdom .

OTHER PUBLICATIONS

Muggli IBM-TDB, 24 (1981), 997.
Chang et al., IBM-TDB, 24 (1982), 5571.

*Primary Examiner*—Upendra Roy
*Attorney, Agent, or Firm*—Antonelli, Terry & Wands

[57] ABSTRACT

The present invention relates to a method of manufacturing a semiconductor integrated circuit device, especially a Bi-MOS IC. It comprises:

1. introducing an impurity of a first conductivity type into a plurality of parts of one major surface of a substrate containing a first conductivity type impurity, to form a plurality of impurity-doped regions which have an impurity density higher than that of said substrate;
2. forming an epitaxial semiconductor layer containing an impurity of a second conductivity type on the one major surface of said substrate;
3. introducing a first conductivity type impurity simultaneously into those parts of a major surface of said epitaxial semiconductor layer which overlie said plurality of impurity doped regions; and
4. introducing the first conductivity type impurity of said plurality of impurity-doped regions into said epitaxial semiconductor layer by drive-in diffusion, and subjecting to drive-in diffusion the first conductivity type impurity introduced in the major surface of said epitaxial semiconductor layer, to connect diffused layers formed by the respective diffusions and to form an isolation region and a semiconductor region for forming a MOS FET.

MOS FETs can be formed in the semiconductor regions and bipolar transistors in a part of the epitaxial semiconductor layer.

11 Claims, 24 Drawing Figures

METHOD OF FORMING BIFETS BY FORMING ISOLATION REGIONS CONNECTED BY DIFFUSION IN SEMICONDUCTOR SUBSTRATE AND EPITAXIAL LAYER

BACKGROUND OF THE INVENTION

The present invention relates to a method of manufacturing a semiconductor integrated circuit device (hereinbelow, termed "Bi-MOS IC") in which bipolar transistors and metal-insulator-semiconductor field effect transistors, e.g., metal-oxide-semiconductor field effect transistors, hereinbelow termed "MOS FETs", are formed within a single semiconductor body.

There have heretofore been developed various processes by which bipolar transistors and n-channel MOS FETs (N-MOS FETs) or complementary MOS FETs (C-MOS FETs) are caused to coexist within a single semiconductor body. An example of conventional processes is as described below:

1 An $n^+$-type buried layer is formed in a part of the major surface of a p-type silicon (Si) substrate. Further, an n-type Si layer is epitaxially grown on the p-type Si substrate.

2 Boron (B) is diffused from parts of the surface of the n-type epitaxial layer so as to form p-type diffused layers for isolation reaching the p-type substrate, thereby to form several electrically-isolated island regions within the n-type Si layer.

3 In another part of the n-type epitaxial layer, a deep p-type region (usually called "p-type well") is formed by similar boron diffusion from the surface of the epitaxial layer.

4 An n-channel MOS FET is formed in the p-type well region. On the other hand, a p-channel MOS FET and a bipolar transistor are formed in the other island regions within the n-type Si layer.

The above process is disclosed in the official gazette of Japanese Laid-Open Patent Application No. 54-131887.

Such process is directed toward a Bi-MOS IC in which the thickness of the epitaxial n-type silicon layer is approximately 10 μm or greater (the depth of an emitter is approximately 5 μm). Recently, ICs have been refined in order to enhance the operating speeds of elements or to reduce the chip area. In this regard, when the thickness of an epitaxial Si layer becomes as small as below 5 μm, the foregoing process brings about the problem that the base-collector breakdown voltage of the bipolar n-p-n transistor lowers.

More specifically, the p-type well for forming the n-channel MOS FET must be rendered deep to some extent (approximately as deep as the epitaxial layer) in order to ensure the source-drain breakdown voltage of the n-channel MOS FET to be formed in the major surface of the well. On the other hand, since the surface density of the p-type well determines the $V_{th}$ (threshold voltage) of the MOS FET, the diffusion of an impurity at a high density is undesirable. In forming the p-type well, therefore, the diffusion treatment needs to be performed at a low density ($C_s \approx 1 \times 10^{16}$ cm$^{-3}$) as well as a high temperature (1200° C.) and for a long time of 4-6 hours. At the heat treatment, an n-type impurity (such as Sb and P) diffuses from the $n^+$-type buried layer, located just under the base layer of the bipolar transistor, upwardly into the epitaxial layer as high as about 3.5 μm and reaches the vicinity of the base layer of the n-p-n transistor. In consequence, the collector-base breakdown voltage lowers.

Therefore, when the upward extension of the $n^+$-type buried layer is taken into account, the thickness of the epitaxial layer is limited to 7 μm as the minimum value. It has been difficult to refine the Bi-MOS IC by forming it at a smaller thickness and to enhance the operating speed of the bipolar transistor.

A second technique, different from the present invention but similar thereto, is disclosed in the official gazette of Japanese Laid-Open Patent Application No. 57-75453. The disclosed process, however, must introduce impurities from the surface of a semiconductor body by separate steps in order to form an isolation region and a p-type well region and has the disadvantage of a larger number of steps.

SUMMARY OF THE INVENTION

An object of the present invention is to provide a method of manufacturing a novel Bi-MOS IC which has a high operating speed and a high density of integration.

The present invention comprises:

1 the step of introducing an impurity of a first conductivity type into parts of one major surface of a substrate containing a first conductivity type impurity, to form a plurality of impurity-doped regions which have an impurity density higher than that of said substrate;

2 the step of forming on the major surface of said substrate an epitaxial semiconductor layer which contains an impurity of a second conductivity type opposite to said first conductivity type;

3 the step of introducing a first conductivity type impurity into those parts of a major surface of said epitaxial semiconductor layer which overlie said plurality of impurity-doped regions; and 4 the step of introducing the first conductivity type impurity of said plurality of impurity-doped regions into said epitaxial semiconductor layer by drive-in diffusion and also subjecting to drive-in diffusion the first conductivity type impurity introduced into the major surface of said epitaxial semiconductor layer in, e.g., the prior step (3), to couple diffused layers formed by the respective diffusions and to form an isolation region and a semiconductor region, e.g., for forming a MOS FET.

Moreover, a parasitic channel-preventive layer can be formed in a major surface of said isolation region.

DESCRIPTION OF THE PREFERRED EMBODIMENTS

Embodiment 1:

FIGS. 1 to 7 illustrate a process for manufacturing a Bi-CMOS IC embodying the present invention.

Figure 1:
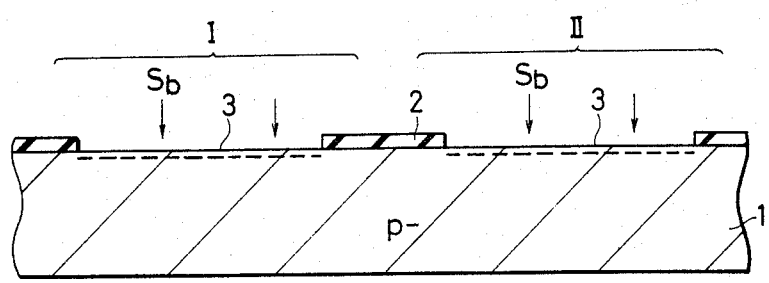
FIGS. 1-7 are sectional flow diagrams which show an embodiment of a process for manufacturing a Bi-CMOS IC according to the present invention.

1 A p$^-$-type silicon (Si) substrate 1 of high resistivity (e.g., 10 ohm-cm) is prepared. Using as a mask an oxide film (SiO$_2$ film) 2, having a thickness of, e.g., 5000-6000 Å, which is formed (e.g., by conventional thermal oxidation) selectively on one major surface of the substrate, as shown in FIG. 1, a donor, e.g., antimony (Sb) for forming high density n$^+$-type buried layers is introduced by an expedient such as deposition (e.g., a coating of a thickness of 100 Å) or ion implantation, using conventional techniques, for example. Dotted lines 3 in FIG. 1 indicate the introduced impurity Sb. Instead of antimony, phosphorus or arsenic could also be used as the donor. In FIG. 1, symbol I denotes a region for forming an n-channel MOS FET, and symbol II a region for forming a bipolar n-p-n transistor.

Figure 2:
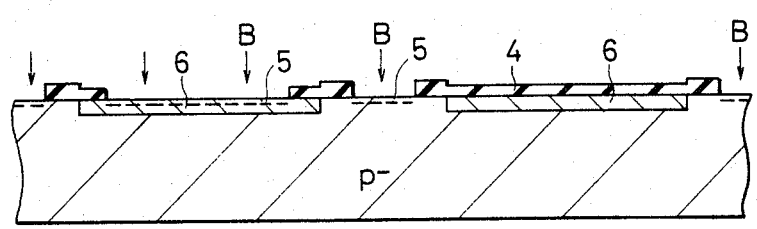

2 Using a new oxide film mask 4 (formed, for example, conventionally by thermal oxidation of the silicon substrate), an acceptor, e.g., boron (B) for forming a p-type well and an isolation portion is introduced by an expedient such as deposition or ion implantation (using, e.g., conventional techniques). As an example, the boron can be deposited to a thickness of 100 Å; moreover, the boron can be ion implanted under the conditions of 75 keV and a dose of 10$^{13}$ atoms/cm$^2$. In FIG. 2, dotted lines 5 indicate the introduced impurity B. By a heat treatment for forming the new oxide film mask 4 (e.g., a heat treatment of 1000° C. for 45 minutes), the Sb introduced in the parts of the major surface of the substrate by the step (1) is subjected to drive-in diffusion to form n$^+$ diffused layers 6.

Figure 3:
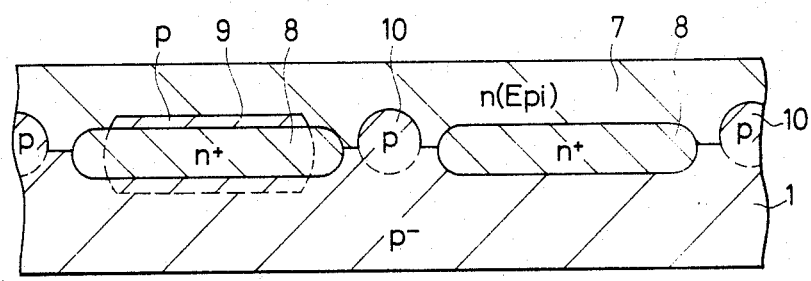

3 As shown in FIG. 3, an n-type Si layer 7 is formed on the whole surface of the substrate to a thickness of approximately 4 μm (such thickness is not limited to 4 μm, and can be, e.g., 3-5 μm) by epitaxial growth which utilizes such an expedient as the thermodecomposition of an Si compound, as is done conventionally. As an example, during formation of the epitaxial n-type Si layer 7, the substrate is held at a temperature of, e.g., 1000°-1,100° C. for 4 minutes. During the formation of the epitaxial n-type Si layer 7, the impurities such as antimony (Sb) and boron (B) introduced by the steps (1) and (2) are introduced into the n-type layer 7 by drive-in diffusion to form the n$^+$-type buried layers 8, a p-type buried layer 9 which is a part of the well and a p-type buried layer 10 which is a part of the isolation portion. Since the diffusion constant of boron (B) is approximately 6 times that of antimony (Sb), the boron is diffused deeper into the epitaxial layer.

Figure 4:
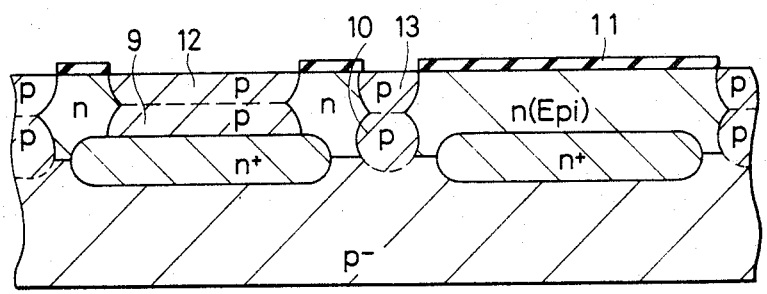

4 Boron (B) for forming the p-type well and the isolation portion is introduced by ion implantation into the epitaxial Si layer through an oxide film mask 11 formed, for example, by conventional thermal oxidation techniques, which mask is formed on the surface thereof as shown in FIG. 4. This oxide film mask 11 can also be formed by chemical vapor deposition (CVD). The dose of the boron in this case is set at approximately 10$^{13}$ atoms/cm$^2$, ion implanted at an energy of, e.g., 75 keV, in conformity with the optimum value for the p-type well; however, such dose is exemplary, and the dose can, e.g., be 10$^{11}$-10$^{13}$ atoms/cm$^2$. Thereafter, by performing an annealing treatment, e.g., at 1000° C. for 5-10 hours, the boron is diffused downwardly to form p-type layers 12 and 13, and the p-type buried layers 9 and 10 are diffusedly extended upwardly in the epitaxial layer to connect the p-type layers 9 and 12 and 10 and 13. Thus, the p-type well 14 and the isolation p-type layer 15 shown in FIG. 5 are formed.

Figure 5:
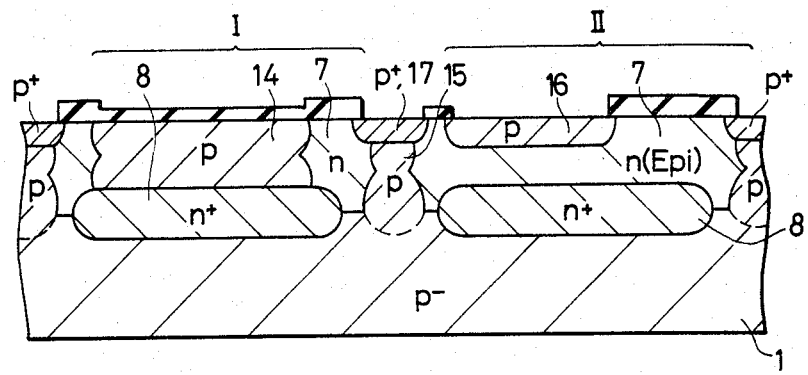

5 As shown in FIG. 5, boron (B) is deposited (or ion-implanted), by conventional techniques, onto (or into) a selected part of the surface of the region II for forming the bipolar transistor, and thereafter subjected to drive-in diffusion, whereby a p$^+$-type diffused layer 16 to become a base is formed to a depth of 1-1.5 μm. As an example, the boron can be ion-implanted under the conditions of 75 keV, with a dose of 10$^{14}$-10$^{15}$ atoms/cm$^2$. The drive-in diffusion is accomplished, for example, by heat treatment at a temperature of, e.g., 1000° C. for, e.g., 30 minutes. Simultaneously with the diffusion of the p$^+$-type base, a p$^+$-type diffused layer 17 is formed in a manner to overlap the surface of the isolation p-type layer 15. Prior to the introduction of the boron, an oxide film mask formed, e.g., by thermal oxidation, is provided on the surface of region I to prevent introduction of boron therein.

Figure 6:
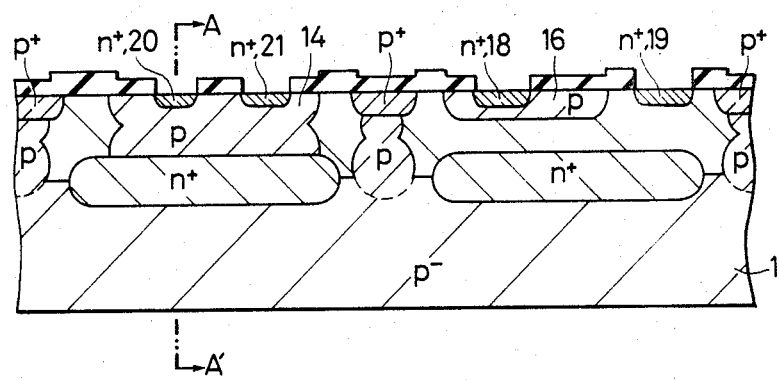

6 As shown in FIG. 6, arsenic (As) or phosphorus (P) is deposited onto (or ion-implanted into) selected parts of the region II and then diffused, whereby an n$^+$-type diffused layer 18 to become an emitter and an n$^+$-type diffused layer 19 to become a collector contact portion are formed. As an example, the arsenic or phosphorus can be ion-implanted under conditions of 75-100 keV, with a dose of 10$^{15}$-10$^{16}$ atoms/cm$^2$; the diffusion treatment can be, e.g., at 1000° C. for 10 minutes. By n$^+$-type diffusion simultaneous with or separate from the above n$^+$-type selective diffusion, n$^+$-type diffused regions 20 and 21 to become a source and a drain are formed in the surface of the p-type well on the side of the region I as shown in FIG. 6. The arsenic or phosphorus is introduced into region II through, e.g., an oxide film mask formed by thermal oxidation and photoetching, which mask also prevents introduction of the impurity into the isolation region. Moreover, the diffused regions 20 and 21 are formed using, e.g., an oxide film mask formed, for example, by thermal oxidation and photoetching on portions of region I.

Figure 7:
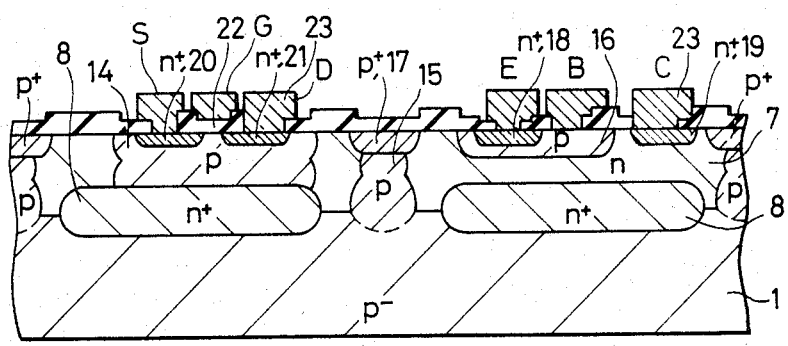

7 In the region I, as shown in FIG. 7, a gate insulating film 22, having a thickness of 300-1000 Å, made of a thin oxide film is formed, for example, by thermal oxidation at 1000° C. for 4 hours, on the surface of the p-type well between the source and the drain. Thereafter, contact holes are provided by photoetching and aluminum (Al) is evaporated, whereupon annealing (for example, at 450° C. for 30 min.) and pattern etching are performed to form Al electrodes 23 which lie in ohmic contact with the respective regions. Then, the n-channel MOS FET is finished up on the side of the region I, while the bipolar n-p-n transistor is finished up on the side of the region II. In the region I of FIG. 7, letter S indicates a source electrode, letter G a gate electrode, and letter D a drain electrode while, in the region II, letter E indicates an emitter electrode, letter B a base electrode and letter C a collector electrode.

Figure 8:
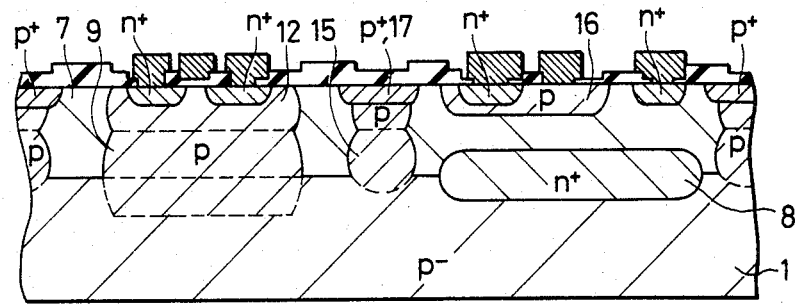
FIG. 8 is a partial sectional view which shows another embodiment of a Bi-CMOS IC according to the present invention.

FIG. 8 is a partial sectional view showing a modification of Embodiment 1. The feature of the modified embodiment is that the n$^+$-type buried layer is not provided in the MOS FET forming region. In this case, the source-drain breakdown voltage of the MOS FET becomes greater than in Embodiment 1 because the upward diffusion of the impurity from the n+buried layer does not occur in the MOS FET region. However, the potential of the p-type well becomes equal to that of the substrate. In FIG. 8, the same portions as in the preceding drawings are assigned the same reference numerals.

Figure 9:
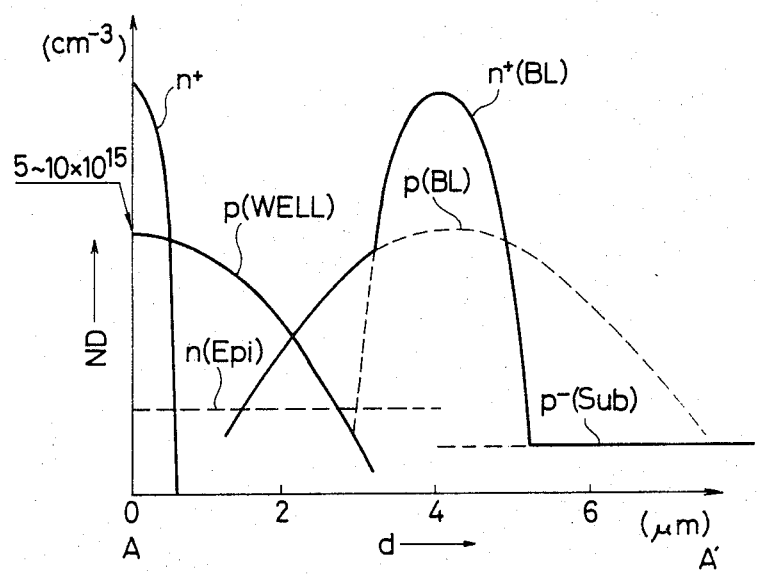
FIG. 9 is an impurity density curve diagram of an n-channel MOS FET in a Bi-CMOS IC according to the present invention.
Figure 10:
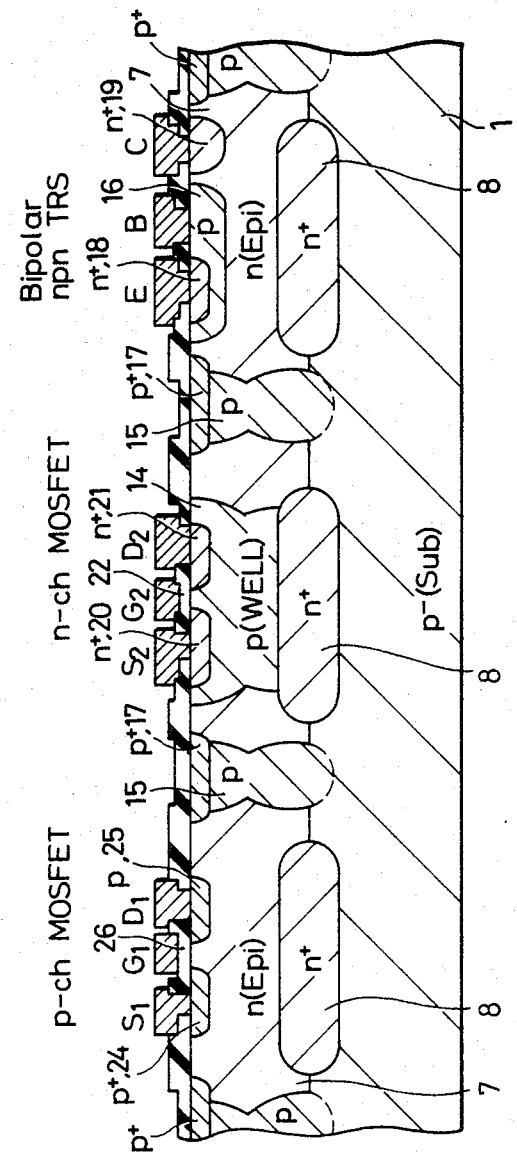
FIG. 10 is a partial sectional view which shows an embodiment of a Bi-CMOS IC according to the present invention.

FIG. 9 shows an impurity density profile in the section of a part of the n-channel MOS FET manufactured by the foregoing process of Embodiment 1 (section A—A' in FIG. 6). In this Figure, the impurity density $N_D$ is taken on the axis of ordinates, while the depth d from the surface is taken on the axis of abscissas. FIG. 10 is a sectional view of the Bi-CMOS IC which has been finished up by the process of this embodiment. In this Figure, the same portions as in the preceding drawings are assigned the same reference numerals. In this Figure, numerals 24 and 25 denote the source and drain of a p-channel MOS FET, and numeral 26 denotes a gate oxide film.

In the process of the Bi-CMOS IC as described above in conjunction with Embodiment 1, in forming the p-type semiconductor region (p-type well) for the n-MOS FET, boron (B) being a p-type impurity is introduced into the major surface of the substrate in advance, and after the growth of the epitaxial layer, the p-type diffusions are performed from the upper and lower surfaces thereof. Therefore, the period of time of the heat treatment for forming the p-type well can be sharply shortened, and the "upwardly extending" diffusion of the n+-type buried layer lessens. Accordingly, even when the thickness of the epitaxial layer is small, the breakdown voltage of the bipolar transistor does not degrade, and it has become possible that the fastoperating bipolar transistor coexists with the MOS FET.

With this method, the impurity density of the buried p-type layer can be selected to the extent that the source-drain breakdown voltage of the surface side of the p-type well does not lower either.

It is, therefore, possible to set the thickness of the epitaxial layer at approximately 4 μm. As a result, the bipolar element can be designed to be a fast-operating transistor having an emitter depth of 3 μm.

Noteworthy in the present process is that the impurity introducing treatments for forming the isolation region and the p-type well region are conducted at the same time. As stated before, the surface impurity density of the p-type well region determines the $V_{th}$ (threshold voltage) of the MOS FET. Therefore, it cannot be rendered very high and is on the order of $10^{16}$ atoms/cm$^3$. On the other hand, the surface impurity density of the isolation region needs to be on the order of $10^{17}$ atoms/cm$^3$ to the end of preventing the appearance of a parasitic channel. In such a case where the required surface impurity densities are unequal, it is common practice that the treatments for introducing the impurity into the regions are individually performed or that a step is added to introduce the impurity into only the isolation region again by ion implantation or the like so as to render the impurity density thereof higher. According to Embodiment 1, the isolation region is formed in conformity with the optimum impurity density of the p-type well region. Thereafter, when the p-type impurity is introduced for forming the base of the bipolar transistor, it is also introduced into the major surface of the isolation region so as to compensate the surface impurity density of this region into a value which is required for isolation, that is, which can prevent the appearance of the parasitic channel. Since, in this manner, the steps are rendered common, increase in the number of steps can be avoided.

The isolation region is formed by the diffusions from the upper and lower parts of the epitaxial semiconductor layer, whereby the lateral diffusion is suppressed to reduce the isolation area. This also contributes to enhancing the density of integration.

In the next place, Embodiments 2 and 3 will indicate examples in which the present invention is applied to a case where devices are further refined and where epitaxial layers are thinned to 1.5-3 μm.

Embodiment 2:

FIGS. 11–20 are sectional flow diagrams corresponding to the following respective steps of a process for a refined Bi-CMOS IC wherein the thickness of an epitaxial layer is as small as 1.5-3 μm and wherein an isolation portion is formed of an oxide film and a diffused layer.

Figure 11:
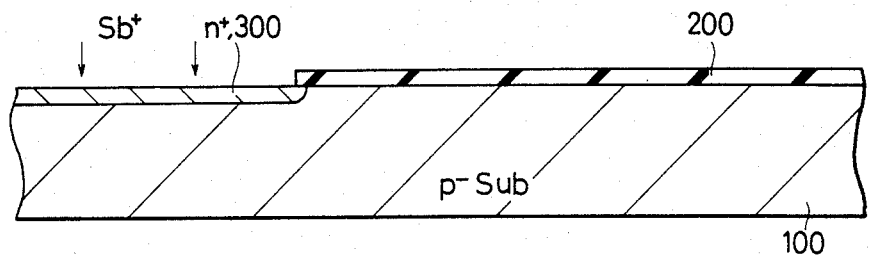
FIGS. 11-20 are sectional flow diagrams which show an embodiment of a Bi-CMOS IC process according to the present invention.

1 As shown in FIG. 11, a p$^-$-type Si crystal substrate 100 of high resistivity is prepared, and an oxide film (SiO$_2$ film) 200 formed by oxidizing the surface thereof is photoetched and Sb (antimony) or the like is deposited and diffused, thereby to form an n+-type buried layer 300. This n+-type buried layer 300 is formed as a part of the collector of a bipolar n-p-n transistor.

Figure 12:
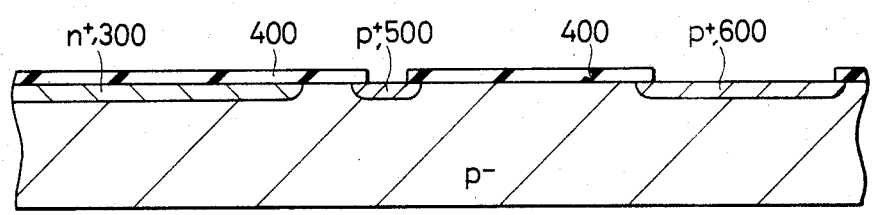

2 An oxide film 400 is formed on the whole surface again. As shown in FIG. 12, it is photoetched to open parts for forming an isolation portion and a well, whereupon B (boron) is deposited (or ion-implanted) and diffused to form p+-type buried layers 500 and 600. The steps (1) and (2) of this Embodiment 2 can be formed using procedures corresponding to the procedures used in steps (1) and (2) of Embodiment 1.

Figure 13:
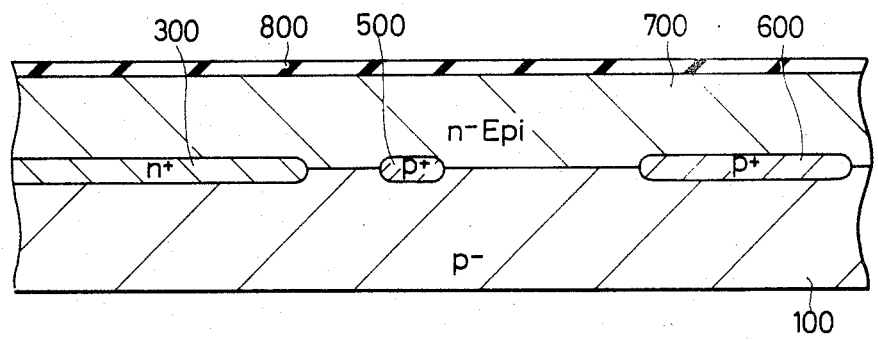

3 As shown in FIG. 13, Si is epitaxially grown on the whole surface so as to form an n-type Si layer 700, which is approximately 3 μm thick (this thickness is not limited to 3 μm, and can be, for example, 1.5-3 μm, based upon operating speeds of the device). The surface of the n-type Si layer 700 is oxidized to form an oxide film 800 (having a thickness, e.g., of 3000–5000 Å).

Figure 14:
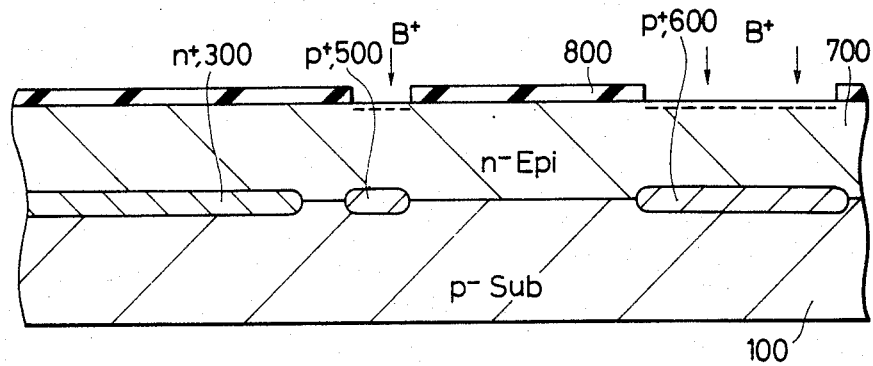

4 As shown in FIG. 14, parts of the oxide film 800 are photoetched and opened in correspondence with the p-type buried layers 500 and 600, whereupon B (boron) is deposited (or ion-implanted). In this case, the impurity is introduced in such a quantity that the surface impurity density of the p-type well becomes the optimum. For example, the ion implantation can be carried out under the conditions of 35–75 keV and a dose of $10^{11}$–$10^{12}$ atoms/cm$^2$.

Figure 15:
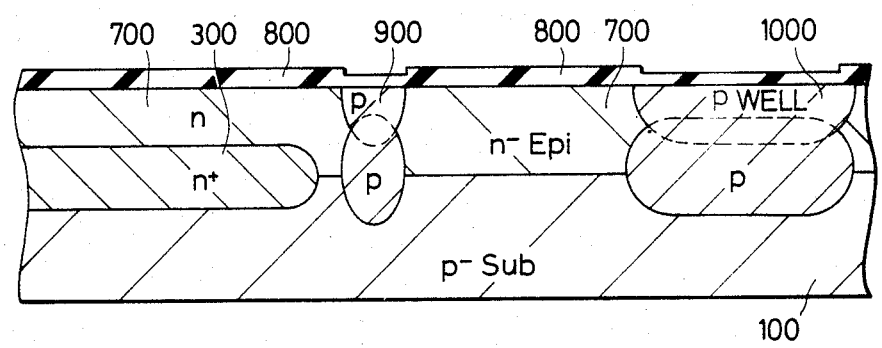

5 In the epitaxial n-type Si layer 700, the B (boron) is diffused from the upper and lower parts thereof, to form the p-type isolation portion 900 and p-type well 1000 as shown in FIG. 15. Such diffusion can be performed at a temperature of 1000° C. for 1–3 hours.

Figure 16:
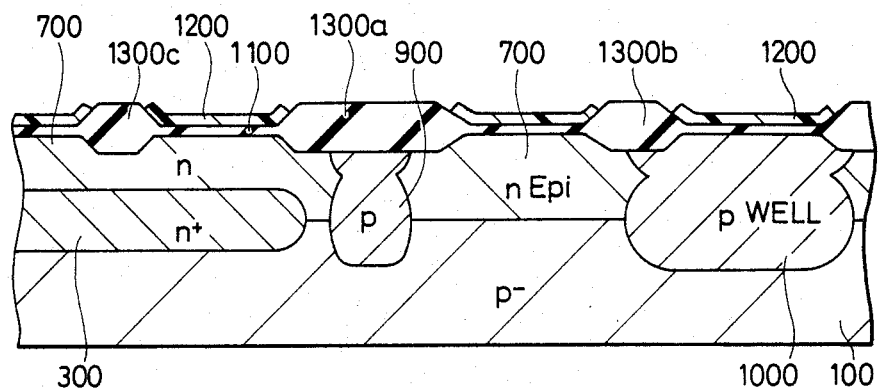

6 The oxide film 800 is etched and removed. Nitride (Si$_3$N$_4$) is deposited on an oxide film 1100 formed anew, and is photoetched to form a nitride film 1200 partly (see FIG. 16). The oxide film and nitride can be formed utilizing procedures conventionally used in, e.g., local oxidation techniques. As an example, the oxide film 1100 can be formed with a thickness of 500–1000 Å, and the nitride formed with a thickness of 1500 Å. Using the nitride film 1200 as a mask, the surface of the n-type Si layer is locally oxidized to form a thick field oxide film 1300 (1300a, 1300b, 1300c) as shown in FIG. 16. The field oxide film 1300 intrudes below the surface of the n-type Si layer 700 to a depth of about 1 μm, and one part thereof 1300a lies in contact with the upper surface of the p-type isolation portion 900 so as to form the isolation portion composed of the two (1300a and 900). Another part 1300b of the field oxide film 1300 is formed in a position where it lies in contact with the peripheral part of the p-type well, and it serves as the isolation portion between the n-type layer and the p-type well. Still another part 1300c serves as the isolation portion between the collector and the base in the surface of the bipolar portion formed with the n+-type buried layer.

Figure 17:
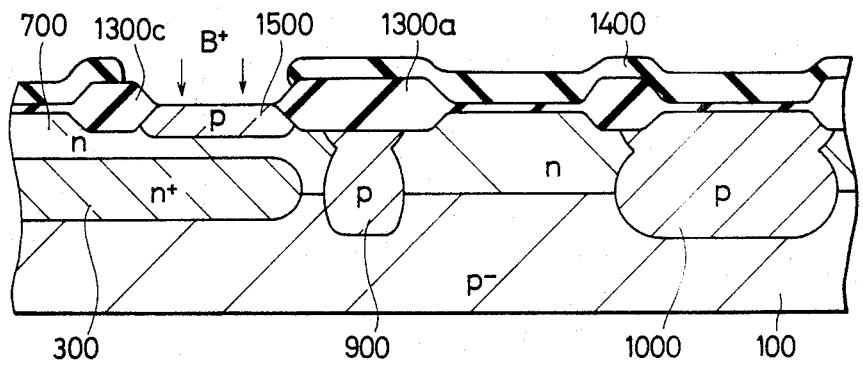

7 As shown in FIG. 17, an $SiO_2$ film 1400 is formed by conventional chemical vapor deposition (hereinbelow termed "CVD"), and a part thereof is opened by photoetching. Using the CVD oxide film 1400 and the field oxide film 1300a, 1300c as a mask, boron is deposited on and diffused into a part of the n-type layer 700 of the bipolar portion, whereby the p-type base 1500 of the n-p-n transistor is formed in self-alignment fashion. The depth of the base in this case is rendered approximately 0.7 $\mu$m.

Figure 18:
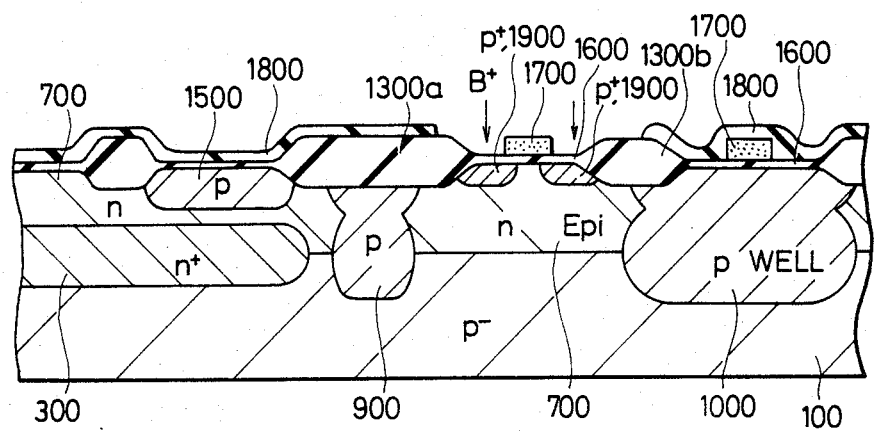

8 After the oxide film 1400 formed by the CVD and a thin oxide film on the surface of the Si layer have been etched and removed, a gate oxide film 1600 is formed by thermal oxidation, and Si is deposited thereon from a vapor phase so as to form a polycrystalline Si layer. Photoetching is subsequently performed to leave polycrystalline Si gates 1700 on the MOS FET side as shown in FIG. 18. A mask made of an oxide film 1800 is formed anew, e.g., by CVD and photoetching, using conventional techniques. Using the field oxide film 1300a, 1300b and polycrystalline Si gate 1700 as a mask, boron (B) is deposited (or ion-implanted) and diffused, whereby the source and drain 1900 of the p-channel MOS FET are formed in self-alignment fashion. The depth of the p+-type source in this case is rendered 0.4–0.5 $\mu$m.

Figure 19:
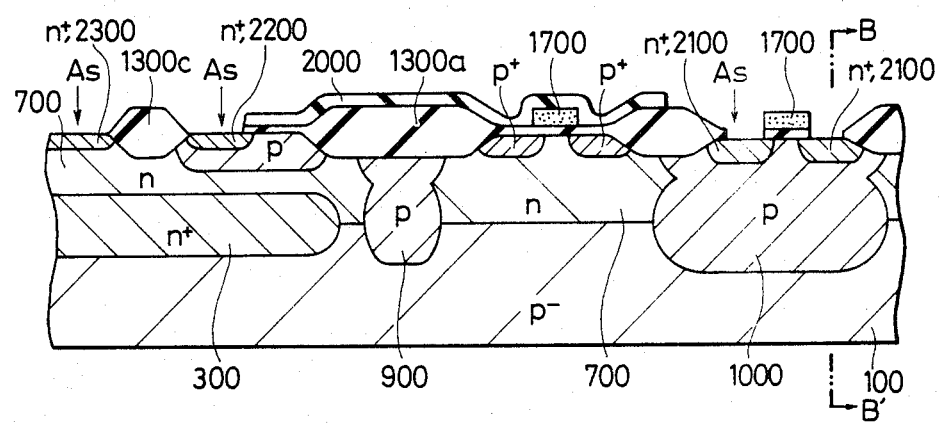

9 The oxide film 1800 is removed. An oxide film 2000 is formed anew by CVD, and is photoetched to open parts thereof as shown in FIG. 19. Arsenic (As) is deposited (or ion-implanted) and then diffused, thereby to form the n+-type source and drain 2100 of the channel MOS FET in the surface of the p-type well 1000 and also to form the n+-type emitter 2200 and the n+-type collector (contact portion) 2300 of the n-p-n transistor. The depth of the emitter in this case is rendered approximately 0.4 $\mu$m. The collector may well be rendered so deep as to reach the n+-type buried layer 300 by another step; for example, phosphorus can be implanted between the steps (5) and (6)described above, at the position of the collector contact portion. Then, during the LOCOS oxidation to form the thick oxide film in step (6), the phosphorus will be subjected to drive-in diffusion to reach the buried n+-type layer 300.

Figure 20:
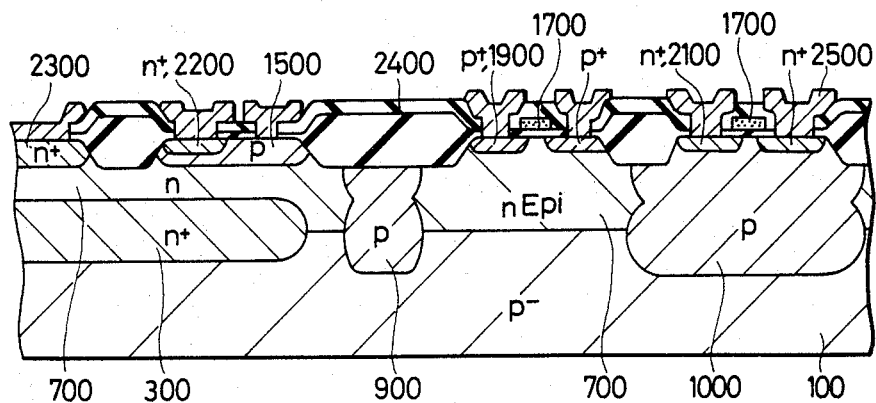

10 The oxide film 2000 is removed, and an insulating film 2400 of PSG (phosphosilicate glass) or the like is formed on the whole surface. After photoetching the PSG film to form contact holes, Al (aluminum) is evaporated and the Al is photoetched. Thus, electrodes 2500 ohmically connected to the respective semiconductor regions are finished up as shown in FIG. 20. Although not shown in this Figure, gate Al electrodes are led out via through-holes provided in the PSG film in the extensions of the polycrystalline Si gates.

Figure 21:
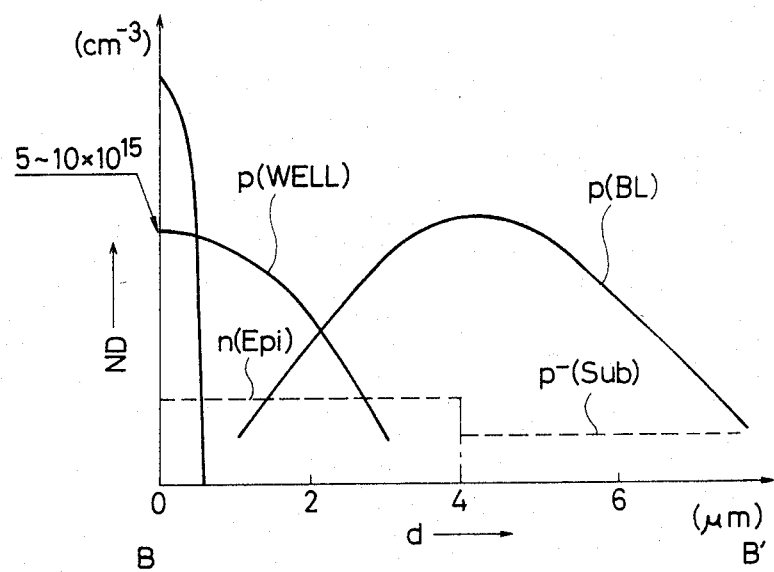
FIG. 21 is an impurity density curve diagram of an n-channel MOS FET in a Bi-CMOS IC according to the present invention.

FIG. 21 shows an impurity density profile in the section of a part of the n-channel MOS FET (section B—B' in FIG. 19) manufactured by the foregoing process.

Figure 22:
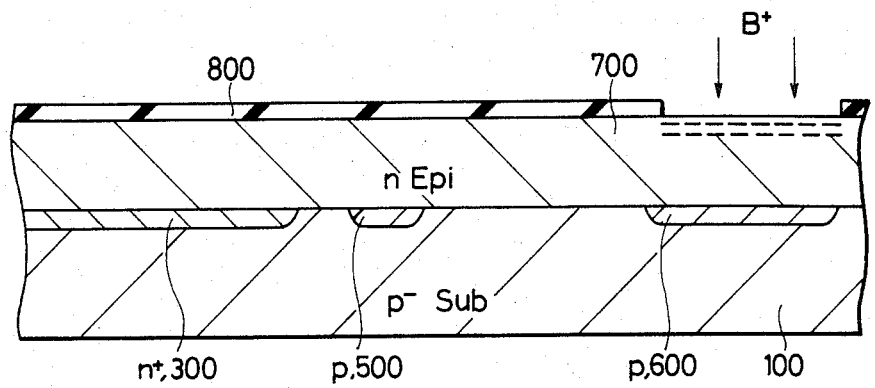
FIGS. 22-24 are sectional partial flow diagrams which show another embodiment of a Bi-CMOS IC process according to the present invention.
Figure 23:
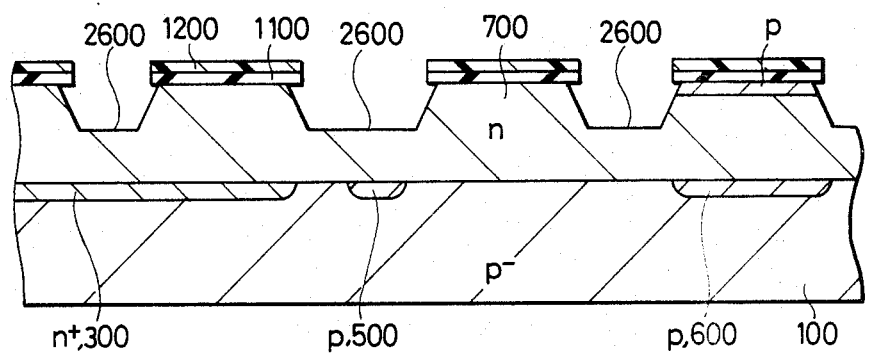
Figure 24:
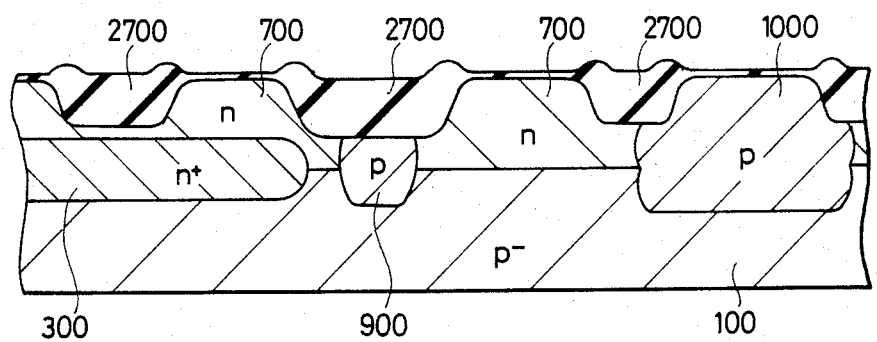

Embodiment 3:

FIGS. 22 to 24 are sectional flow diagrams corresponding to the essential steps in the case where the present invention is applied to a Bi-CMOS IC process wherein an isolation portion is previously formed with a recess, in which an oxide film and a diffused layer are formed.

1 Via a process similar to the steps (1)–(3) of Embodiment 1, an n+-type buried layer 300 and p-type buried layers 500,600 are formed in the surface of a p−-type substrate 100 as shown in FIG. 22. An epitaxial n-type layer 700 which is approximately 3 $\mu$m thick is formed on the resultant substrate. An oxide film 800 on the surface of the layer 700 is partly opened, and boron for forming a well is implanted.

2 As shown in FIG. 23, a nitride ($Si_3N_4$) film 1200 is formed on parts of the oxide film. Using the nitride film 1200 as a mask, parts to form field insulator films are selectively etched so as to form recesses 2600. The selective etching forms the deep recesses having abrupt inclined surfaces, by utilizing the anisotropy of the Si crystal surface and alkali etching with KOH or the like. The depth of the recess is rendered approximately 0.7–1 $\mu$m by way of example.

3 Thereafter, a heat treatment is conducted at 1200° C. for about 1–5 hours. Thus, as shown in FIG. 24, the impurities (Sb, B) are diffused into the epitaxial n-type layer 700 from the n+-type buried layer 300 and p-type buried layers 500, 600 formed in the surface of the p-type substrate to form a p-type well 1000 by diffusions from the upper and lower portions in a part and to form an isolation p-type layer 900 reaching the bottom of the recess in another part. Subsequently, using the nitride film as a mask, an oxidizing treatment at 1000° C. for about 2 hours is conducted in a conventional wet $O_2$ atmosphere under a high pressure (e.g., 3800 mm of Hg) to form a thick field oxide film 2700 on the surfaces of the recesses. In a part of the oxide film, an isolation portion is constructed of the p-type diffused layer 900 and the oxide film (FIG. 24). In this case, the thickness of the field oxide film under the surface of the epitaxial layer may be substantially equal to that approximately 1 $\mu$m) of the field oxide film (FIG. 16) in the case of embodiment 2. The parts of the field oxide film above the surface of the epitaxial layer are compensated by the recesses formed before the oxidation, whereby a comparatively flat upper surface of small ruggedness is obtained.

Thereafter, the Bi-CMOS IC is finished up by a process similar to the steps (7)–(10) of Embodiment 2 (FIGS. 17–20). In Embodiments 2 and 3 described above, the p-type well is formed in the shape in which it is directly coupled with the p−-type substrate. In the upward and downward diffusions for forming the well, therefore, the density of the diffusion from the lower portion (the p-type buried layer) can be rendered higher than that from the upper portion, and the downward diffusion rate can be increased in the state in which the upper portion to form the MOS FET therein is held at a low density as compared with the lower portion (e.g., the dose for the lower portion can be $10^{13}$–$10^{14}$ atoms/cm$^2$, while the dose for the upper portion can be $10^{11}$–$10^{12}$ atoms/cm$^2$). Thus, the period of time of the heat treatment for forming the well region is shortened to about $\frac{1}{4}$ of that in the prior art method, and the "upward extension" of the n+buried layer on the bipolar side can be suppressed to about $\frac{1}{2}$ of that in the prior art method.

Accordingly, even in the case where the epitaxial layer is as thin as 1.5 μm–3.0 μm, the low density epitaxial layer 0.7 μm–1.3 μm thick remains even after the upward extension of the n+-type buried layer, so that the characteristics of the n-p-n transistor do not degrade.

Since the n+buried layer is not formed in the MOS FET forming region, the heat treatment is not attended with the diffusion of an impurity into the epitaxial layer, so that the source-drain breakdown voltage does not degrade.

In Embodiment 2, likewise to Embodiment 1, the impurity is introduced into the major surfaces of the isolation forming region and the p-type well forming region at the density at which the p-type well comes to have the optimum impurity density, and the heat treatment is conducted to form the p-type well and the isolation region. The thick oxide film is thereafter formed on the isolation region so as to prevent the appearance of a parasitic channel ascribable to the inversion of the p⁻-type substrate. This thick oxide film serves also as a mask for the diffusion of the base of the n-p-n transistor.

In this manner, the steps are made common to prevent the increase of the number of steps. The thick oxide film also has the advantage that the junction capacitance is small, so that the operating speed of the transistor is not degraded.

Embodiment 3 is a modification of the present invention, and attains effects similar to those of Embodiments 1 and 2.

In addition, since the diffusion of the p-type well and that of the isolation p-type layer are simultaneously performed from below, the process is shortened and the lateral spread of the portions can be suppressed.

The formation of the field oxide film requires a heat treatment at a temperature of about 1000° C. for about 7 hours in case of the normal pressure. Since, however, this temperature is low in comparison with 1200° C., which is the temperature of the diffusion of the p-type well, the heat treatment little affects the upward extension of the n+-type buried layer.

As explained above in conjunction with the embodiments, according to the present invention, a refined fastoperating bipolar transistor having an epitaxial layer whose thickness is 5 μm or less is permitted to coexist with a MOS FET, and the area of the element can be reduced, whereby a Bi-MOS IC of high operating speed and large capacity can be provided. The present invention is applicable to the general processes of Bi-CMOS ICs and Bi-n-channel MOS ICs, and it is effective especially when applied to devices aiming at a high operating speed and a high density of integration, for example, a gate array of at least 1 k gates.

What is claimed is:

1. A method of manufacturing a semiconductor integrated circuit device comprising the steps of:
   1 introducing an impurity of a first conductivity type into a plurality of parts of one major surface of a substrate containing a first conductivity type impurity, to form a plurality of impurity-doped regions which have an impurity density higher than that of said substrate, said plurality of parts being formed at locations for pn-junction isolation portions and a semiconductor region for forming a MOS FET;
   2 forming an epitaxial semiconductor layer containing an impurity of a second conductivity type on the one major surface of said substrate;
   3 introducing a first conductivity type impurity simultaneously into those parts of a major surface of said epitaxial semiconductor layer which overlie said plurality of impurity-doped regions;
   4 diffusing the first conductivity type impurity of said plurality of impurity-doped regions into said epitaxial semiconductor layer by a heat treatment, and subjecting to drive-in diffusion the first conductivity type impurity introduced in the major surface of said epitaxial semiconductor layer, to connect diffused layers formed by the respective diffusions and to form the pn-junction isolation portions and a semiconductor region for forming a MOS FET simultaneously;
   5 forming the MOS FET in said semiconductor region; and
   6 forming a bipolar transistor in a part of said epitaxial semiconductor layer.

2. A method of manufacturing a semiconductor integrated circuit device comprising the steps of:
   1 introducing an impurity of a first conductivity type into a plurality of parts of one major surface of a substrate containing a first conductivity type impurity, to form a plurality of impurity-doped regions which have an impurity density higher than that of said substrate;
   2 forming an epitaxial semiconductor layer containing an impurity of a second conductivity type on the one major surface of said substrate;
   3 introducing a first conductivity type impurity simultaneously into those parts of a major surface of said epitaxial semiconductor layer which overlie said plurality of impurity-doped regions;
   4 diffusing the first conductivity type impurity of said plurality of impurity-doped regions into said epitaxial semiconductor layer by a heat treatment, and subjecting to drive-in diffusion the first conductivity type impurity introduced in the major surface of said epitaxial semiconductor layer, to connect diffused layers formed by the respective diffusions and to form a pn-junction isolation portion and a semiconductor region for forming a MOS FET;
   5 forming a thick oxide film on the part of the major surface of said epitaxial semiconductor layer which overlies said impurity-doped region for the pn-junction isolation portion;
   6 forming the MOS FET in said semiconductor region; and
   7 forming a bipolar transistor in part of said epitaxial semiconductor layer.

3. A method of manufacturing a semiconductor integrated circuit device according to claim 2, comprising the step of introducing a first conductivity type impurity into a selected part of the major surface of said epitaxial semiconductor layer by using as a mask said thick oxide film formed on said major surface of said isolation region, to form a base of the bipolar transistor.

4. A method of manufacturing a semiconductor integrated circuit device according to claim 2, comprising the step of introducing a second conductivity type impurity into said base of said bipolar transistor, to form an emitter thereof, and introducing said second conductivity type impurity also into the semiconductor region, to form a source and drain of said MOS FET.

5. A method of manufacturing a semiconductor integrated circuit device according to claim 2, wherein the epitaxial semiconductor layer has a thickness of less than 5 μm.

6. A method of manufacturing a semiconductor integrated circuit device according to claim 2, wherein the impurity of a first conductivity type introduced in step (1) is introduced at a greater dose than the impurity of a first conductivity type introduced in step (3).

7. A method of manufacturing a semiconductor integrated circuit device according to claim 4, wherein the introducing of the second conductivity type impurity into said base and into the semiconductor region is performed simultaneously.

8. A method of manufacturing a semiconductor integrated circuit device according to claim 4, wherein the first conductivity-type impurity density of the impurity introduced into a plurality of parts of the one major surface of the substrate for forming the semiconductor region for forming a MOS FET is greater than the first conductivity type impurity density of the impurity introduced into the major surface of said epitaxial semiconductor layer overlying the impurity-doped regions for forming the semiconductor region for forming a MOS FET.

9. A method of manufacturing a semiconductor integrated circuit device according to claim 4, wherein the epitaxial semiconductor layer has a thickness of 1.5–3.0 $\mu$m.

10. A method of manufacturing a semiconductor integrated circuit comprising the steps of:
 1 introducing an impurity of a first conductivity type into a plurality of parts of one major surface of a substrate containing a first conductivity type impurity, to form a plurality of impurity-doped regions which have an impurity density higher than that of said substrate;
 2 forming an epitaxial semiconductor layer containing an impurity of a second conductivity type on the one major surface of said substrate;
 3 introducing a first conductivity type impurity simultaneously into those parts of a major surface of said epitaxial semiconductor layer which overlie said plurality of impurity-doped regions;
 4 diffusing the first conductivity type impurity of said plurality of impurity-doped regions into said epitaxial semiconductor layer by a heat treatment, and subjecting to drive-in diffusion the first conductivity type impurity introduced in the major surface of said epitaxial semiconductor layer, to connect diffused layers formed by the respective diffusions and to form a pn-junction isolation portion and a semiconductor region for forming a MOS FET;
 5 introducing a first conductivity type impurity into a part of said epitaxial semiconductor layer in order to form a base of a bipolar transistor, and introducing said first conductivity type impurity also into a major surface of sdid isolation portion, to form a high density region in the major surface of said isolation portion, to form said high density region having an impurity density higher than that of the other part of said isolation portion;
 6 forming the MOS FET in said semiconductor region; and
 7 forming said bipolar transistor in a part of said epitaxial semiconductor layer.

11. A method of manufacturing a semiconductor integrated circuit device comprising the steps of:
 1 introducing an impurity of a first conductivity type into a plurality of parts of one major surface of a substrate containing a first conductivity type impurity, to form a plurality of impurity-doped regions which have an impurity density higher than that of said substrate;
 2 forming an epitaxial semiconductor layer containing an impurity of a second conductivity type on the one major surface of said substrate;
 3 introducing a first conductivity type impurity into parts of a major surface of said epitaxial semiconductor layer which overlie said plurality of impurity-doped regions;
 4 forming recesses in parts of the major surface of said epitaxial semiconductor layer;
 5 conducting a heat treatment to introduce the first conductivity type impurity of said plurality of impurity-doped regions into said epitaxial semiconductor layer by diffusion so as to connect the diffused layer with a diffused layer formed by subjecting to drive-in diffusion the first conductivity type impurity introduced in said major surface of said epitaxial semiconductor layer, thereby to form a first conductivity type semiconductor region in a part of said epitaxial semiconductor layer and to form a pn-junction isolation diffused portion reaching a bottom of the recesses, in another part of said epitaxial semiconductor layer;
 6 forming a thick oxide film on major surfaces of said recesses;
 7 forming a MOS FET in said semiconductor region; and
 8 forming a bipolar transistor in a part of said epitaxial semiconductor layer.

* * * * *

UNITED STATES PATENT AND TRADEMARK OFFICE
CERTIFICATE OF CORRECTION

PATENT NO. : 4,529,456

DATED : July 16, 1985

INVENTOR(S) : Anzai et al.

It is certified that error appears in the above-identified patent and that said Letters Patent is hereby corrected as shown below:

Column 12, line 4, "sdid" should read -- said --.

Signed and Sealed this

Nineteenth Day of August 1986

[SEAL]

Attest:

DONALD J. QUIGG

Attesting Officer

Commissioner of Patents and Trademarks